United States Patent [19]
Uesawa et al.

[11] Patent Number: 5,397,663
[45] Date of Patent: Mar. 14, 1995

[54] PHASE SHIFT MASK AND METHOD OF MANUFACTURING THE SAME

[75] Inventors: Fumikatsu Uesawa; Michio Negishi; Hideo Shimizu, all of Kanagawa, Japan

[73] Assignee: Sony Corporation, Tokyo, Japan

[21] Appl. No.: 113,899

[22] Filed: Aug. 31, 1993

[30] Foreign Application Priority Data

Aug. 31, 1992 [JP] Japan .................................. 4-255793
Jan. 30, 1993 [JP] Japan .................................. 5-034877

[51] Int. Cl.$^6$ .............................................. G03F 9/00
[52] U.S. Cl. .......................................... 430/5; 430/323
[58] Field of Search ................................... 430/5, 323

[56] References Cited
FOREIGN PATENT DOCUMENTS
0432900 6/1991 European Pat. Off. .

OTHER PUBLICATIONS
Ohtsuka et al (Conjugate Twin-Shifter Masks with Multiple Focal Planes).

Primary Examiner—S. Rosasco
Attorney, Agent, or Firm—Hill, Steadman & Simpson

[57] ABSTRACT

An exposure mask and an exposure method are provided, which can suppress adverse effects of interference edge patterns (sub-shifters) located around a central pattern.

The exposure mask has central patterns and edge patterns arranged around each central pattern. The mutual interference of edge patterns is reduced by providing an angle or a phase difference between vicinity edge patterns, or providing a single edge pattern to reduce the light transmission.

8 Claims, 22 Drawing Sheets

PHASE SHIFT MASK AND METHOD OF MANUFACTURING THE SAME

BACKGROUND OF THE INVENTION

1. Field of the Invention

This invention relates to an exposure mask and an exposure method and, more particularly, to a phase shift exposure mask and a method of phase shift exposure using the same. The exposure mask and exposure method according to the invention are applicable as a technique for forming various patterns; for instance they can be utilized in the exposure in semiconductor device manufacture processes for forming various resist patterns or like patterns.

2. Prior Art

In the manufacture of semiconductor devices or the like using photo-resist masks for pattern formation, there is a trend for finer processing dimensions. In these circumstances, in the technology of photolithography for obtaining semiconductor devices having fine structures, phase shift techniques are attracting attentions with an aim to improve the resolution The phase shift techniques are for improving the light intensity profile by providing a phase difference to light transmitted through a mask.

Among the prior art phase shift techniques are those disclosed in Japanese Patent Laid-Open Publication No. S58-173744, Marc D. Levenson et al "Improving Resolution in Photolithography with a Phase-Shifting Mask:", IEEE Transactions on Electron Devices, Vol. ED-29, No. 12, December 1982, p-p. 1828–1836, and Mark D. Levenson et al "The Phase-Shifting Mask I: Imaging Simulations and Submicrometer Resist Exposures", IEEE Transactions on Electron Devices, Vol. ED-31, No. 6, June 1984, p-p. 753–763.

Further, in Japanese Patent Publication No. s62-50811 is disclosed a phase shift mask, which has a predetermined pattern having a non-transparent portion and transparent portions on the opposite sides of the non-transparent portion, at least one of the transparent portions being provided with a phasing member to provide a phase difference between the opposite side transparent portions.

FIG. 1 illustrates a well-known phase shift technique called Levenson type. This technique will now be described. As shown in Fig. 1(a), on a transparent substrate 1, for instance a quartz substrate, a light-blocking pattern 10 is formed by using a light-blocking material, by using chromium (Cr) or like metal or a metal oxide, thus forming a line-and-space recurrence pattern as an exposure mask. The intensity distribution of light transmitted through the exposure mask is as shown by a plot A1 in Fig. 1(a), ideally being zero in correspondence to the light-blocking pattern 10 and at a certain level in correspondence to the other portions (i.e., transmitting portions 12a, 12b). With respect to the transmitting portion 12a, for instance, the transmitted light given to the exposed material has an intensity distribution as shown by plot A2 in Fig. 1(a), having hill-like maxima which are produced by diffraction of light or like cause in opposite side foot portions. The transmitted light A2' in the transmitting portion 12b is shown by a dashed plot. The resultant light transmitted through the transmitting portions 12a and 12b, as shown by plot A3, has an intensity distribution lacking in sharpness. Dimness of image thus results from the diffraction of light, and therefore, it is impossible to attain sharp exposure. To cope with this drawback, it is thought to provide a phase shifter 11a (commonly called shifter and formed by using SiO₂, a resist or like material) on every other one of the transmitting portions 12a, 12b in the recurring pattern. With this arrangement, the dimness of image due to the diffraction of light is canceled by phase inversion, as shown in Fig. 1(b). Thus, it is possible to obtain transfer of sharp image and improve the resolution and focal point redundancy. More specifically, if the phase shifter 11a formed on the transmitting portion 12b can provide a phase shift by 180°, for instance, light transmitted through the phase shifter 11a is inverted as shown by plot B1. On the other hand, light from the adjacent transmitting portion 12b is not transmitted through any phase shifter and hence is not inverted. The light which reaches the exposed material, that which is inverted and that which is not, cancel each other in the foot portions of their intensity distributions, as shown by plot B2. Consequently, the intensity distribution of light which reaches the exposed material has an ideal sharp form as shown by plot B3 in Fig. 1(b).

In this case, to make the effect most reliable it is most advantageous to cause 180° phase inversion. To this end, the phase shifter 11a is formed as a film with a thickness D of $$D = \lambda/(2(n-1))$$

where n is the refractive index of the phase shifter material, and λ is the exposure wavelength.

In forming a pattern through exposure, a pattern produced by contracted scale production is called a reticle, while that which is produced by equal scale production is called a mask. Alternatively, what corresponds to an original is called a reticle, and its duplicate is called a mask. According to the invention, the masks and reticles which are used with various senses as noted above are generally referred to as masks.

The phase shift mask as noted above, in which the phase of light is shifted (ideally subjected to 180° inversion) between adjacent light transmitting portions), is referred to as spacial frequency modulation type (or Levenson type). There are various other shift masks including an edge emphasis type, a light-blocking effect emphasis type, etc. Among these phase hift masks are those without any light-blocking portion ((such as those called chromium-less type). In any of these phase shift masks, the portion for transmitting exposure light is at least locally provided with a phase shifter for causing a phase shift.

The above technology of the phase shift mask utilization is very effective for line-and-space or like recurrence patterns such as shown in FIG. 5. However, it presents inconvenience in the case of forming a non-recurrent independent pattern.

More specifically, in the phase shift technique a phase difference is given light portions for exposure for adjacent patterns, thereby utilizing an effect of cancellation of the two light intensity distributions. When forming an independent line or a contact hole, there are no light portions in the proximity of one another. In such a case, therefore, it is impossible to obtain direct realization of the phase shift technique.

As shown in FIG. 6, therefore, it has been necessary to provide, in addition to a transmitting portion 12 (with a phase shift of 0°), which is provided in correspondence to the pattern to be formed such as to transmit exposure light without phase shift, phase shifters 11 (with a phase shift amount of 180°, for instance) in the vicinity of the transmitting portion 12 (see Terasawa et al, The 49-th symposium of the Japan Society of Applied Physics, Autumn 1988, No. 2, p. 497, 4a-K-7).

In the prior art as above, it is necessary to provide in the light-blocking portion 10 a main space for forming the transmitting portion 12 for pattern formation and sub-spaces for forming the phase shifters 11. In the independent line pattern formation mask shown in FIG. 2(a), such phase shifters 11 are formed along and in the vicinity of the opposite sides of a longitudinally elongate transmitting portion 12 as the main space. In the hole pattern formation mask as show in FIG. 2(b), phase shifters 11 are formed in the vicinity of and along four sides of a rectangular transmitting portion 12. Particularly, the mask pattern shown in FIG. 2(b) is considerably effective in contact hole formation using a positive resist.

The method of using such an exposure mask, in which auxiliary transmitting portions (called sub-shifters) are formed along the sides of the central pattern such that they are shifted in phase with respect to the central pattern, is called a sub-shifter type phase shift method.

The sub-shifter type phase shift method is effective for such purpose as increasing the resolution of independent patterns. This will be described hereinafter in detail. The method is typically shown in FIG. 3. As shown, along the four sides of a central pattern C phase shifters (i.e., sub-shifters) are provided as edge patterns S1 to S4 to elevate the contrast of the pattern. There are of course optimum positions of disposition and dimensions of the sub-shifters. In the case of i-beam exposure light, for instance, for a square central pattern C (hole pattern) with one side length $L_3$ of 0.40 micron, the length $L_1$ and width $L_4$ of each sub-shifter are 0.45 and 0.20 micron, respectively, and the distance $L_2$ thereof with respect to the corresponding side of the central pattern is 0.575 micron.

As is seen from FIG. 3, by arranging the sub-shifters along the four sides of the central pattern the size of the overall pattern is increased. This means that where there are two or more such pattern groups, a limitation is imposed on the distance, at which two contact holes can be close to each other. FIG. 4 shows an example, in which two contact holes (central patterns C1 and C2) are too close to each other. In this case, adjacent sub-shifters S2 and S2' among the sub-shifters S1 to S4 and S1' to S4' are merged together to form a peak. Labeled D is the center-to-center distance between the two contact holes (central patterns C1 and C2). The merged peak has a higher intensity than those of the outer sub-shifters. This is so because the inner sub-shifters are influenced by diffracted light form the opposite side contact holes, while the other sub-shifters receive influence of only a single associated contact hole. Further, the intensity of the main peak is reduced by the influence of proximity. These phenomena will naturally pose future problems in attempts to further increase the LSI integration density.

As noted above, in the sub-shifter type phase shift method it is necessary to dispose sub-shifters in an optimum distance relation to the central pattern. For example, when a contact hole of 0.4 micron is to be formed by using i beam and under conditions of =365 nmλ,
NA=0.50,
$<$=0.3 and
Focus=Best Focus, it is necessary to dispose each sub-shifter at a position of 575 microns from the hole center.

FIG. 5 shows light intensity distributions obtained by simulation with and without sub-shifters. The solid curve represents the case with sub-shifters, and the dashed curve represents the case without sub-shifters. The calculations were made with the length and width of sub-shifters set to 0.45 and 0.20 microns, respectively. As is obvious from the graph, the provision of the sub-shifters has an effect of greatly improving the contrast.

FIG. 5 shows the result of simulation carried out under the above conditions with the center-to-center distance D between two contact holes set to 1.6 microns. The adjacent inner sub-shifters are merged together to form a peak. The intensity of the merged peak is as high as 0.31 in comparison to an outer peak intensity of 0.23.

FIG. 6 shows light intensity distributions in cases of D=2.0 micron and D=1.6 micron. A slight main peak intensity fall from 0.8 to 0.78 micron will be seen, which is due to the influence of the distance reduction. When the distance is reduced down to D=1.4 micron, the peak intensity provided by the sub-shifters is increased up to 0.71 micron, as shown in FIG. 7. This is substantially the same as in the claim, in which three contact holes are formed by using the Levenson type phase shift method.

SUMMARY OF THE INVENTION

The invention has an object of providing an exposure mask and an exposure method, which can suppress adverse effects of the mutual interference of edge patterns (i.e., sub-shifters).

To attain the above object, according to a first aspect of the invention there is provided an exposure mask, which comprises a pattern group including a central pattern and edge patterns located along edges of said central pattern, and which can reduce mutual interference of said edge patterns.

To attain the above object, according to a second aspect of the invention there is provided a sub-shifter phase shift exposure method of, which uses an exposure mask having isolated patterns and sub-shifters, which are provided around the isolated patterns to increase the resolution of the isolated pattern apertures, the sub-shifters being disposed in such phase as to reduce mutual interference of nearby ones of them between adjacent isolated patterns.

To attain the above object, according to a third aspect of the invention there is provided a sub-shifter phase shift exposure mask used for a sub-shifter phase shift method of exposure, which uses an exposure mask having isolated patterns and sub-shifters, which are provided around the isolated patterns to increase the resolution of the isolated pattern apertures, the sub-shifters being disposed such that nearby ones of them are at an angle between adjacent isolated patterns.

To attain the above object, according to a fourth aspect of the invention, there is provided a sub-shifter phase shift exposure mask used for a sub-shifter phase shift method of exposure, which uses an exposure mask having isolated patterns and sub-shifters, which are provided around the isolated patterns to increase the resolution of the isolated pattern apertures, a phase difference being provided between nearby ones of the sub-shifters between isolated patterns adjacent to these sub-shifters.

To attain the above object, according to a fifth object of the invention there is provided a sub-shifter phase shift exposure method, which uses an exposure mask having isolated patterns and sub-shifters, which are provided around the isolated patterns to increase the resolution of the isolated pattern apertures, nearby ones of the sub-shifters being at an angle between adjacent isolated patterns.

To attain the above object, according to a sixth aspect of the invention there is provided a sub-shifter phase shift exposure method, which uses an exposure mask having isolated patterns and sub-shifters, which are provided around the isolated patterns to increase the resolution of the isolated pattern apertures, a phase difference being provided between nearby ones of the sub-shifters between isolated patterns adjacent to these sub-shifters.

To attain the above object, according to a seventh aspect of the invention there is provided a sub-shifter phase shift exposure mask used for a sub-shifter phase shift method, which uses an exposure mask having isolated patterns and sub-shifters, which are provided around the isolated patterns to increase the resolution of the islated pattern apertures, the isolated patterns being close to each other by at least a fixed distance, a single sub-shifter being formed between adjacent isolated patterns.

To attain the above object, according to an eighth aspect of the invention, in the phase shift exposure mask according to the seventh aspect of the invention the center-to-center distance between a sub-shifter, which is formed between isolated patterns close to each other by at least a predetermined distance, and that isolated patterns is in a range of $0.75 \times \lambda/NA$ to $1.0 \times \lambda/NA$.

To attain the above object, according to a nineth object of the invention there is provided a sub-shifter phase shift exposure mask used for a sub-shifter phase shift method, which uses an exposure mask having isolated patterns and sub-shifters, which are provided around the isolated patterns to increase the resolution of the isolated pattern apertures, the isolated patterns being close to one another by at least a predetermined distance, a single sub-shifter being provided between isolated patterns such as to be common to the closest isolated patterns.

To attain the above object, according to a tenth aspect of the invention, in the phase shift exposure mask according to any of the seventh to nineth aspects of the invention a sub-shifter formed between nearby isolated patterns close to each other by at least a predetermined distance has a small area compared to the other sub-shifters.

To attain the above object, according to the eleventh aspect of the invention, in the phase shift exposure mask according to any of the seventh to nineth aspects of the invention a sub-shifter formed between isolated patterns close to each other by at least the predetermined distance has a low exposure light permeability compared to the other sub-shifters.

To attain the above object, according to a twelfth aspect of the invention there is provided a sub-shifter phase shift exposure method used for a sub-shifter phase shift method, which uses an exposure mask having isolated patterns and sub-shifters, which are provided around the isolated patterns to increase the resolution of the isolated pattern apertures, a single sub-shifter providing a phase shift effect to a plurality of the closest isolated patterns being provided on each side of the sub-shifters.

To attain the above object, according to a thirteenth aspect of the invention there is provided a sub-shifter phase shift exposure mask used for a sub-shifter phase shift method, which uses an exposure mask having isolated patterns and sub-shifters, which are provided around the isolated patterns to increase the resolution of the isolated pattern apertures, and in which a single sub-shifter is provided between them and such as to be common to isolated patterns closest to each other by at least a predetermined distance, said single sub-shifter being divided into a plurality of areas deviated in phase with respect to one another.

To attain the above object, according to a fourteenth aspect of the invention there is provided a sub-shifter phase shift exposure mask used for a sub-shifter phase shift method, which uses an exposure mask having isolated patterns and sub-shifters, which are provided around the isolated patterns to increase the resolution of the isolated pattern apertures, and in which a single sub-shifter is provided between them and such as to be common to isolated patterns closest to each other by at least a predetermined distance, said single sub-shifter being divided into a plurality of areas deviated in phase with respect to one another, said single sub-shifter having a central portion with a zero phase shift.

In the thirteenth and fourteenth aspects of the invention, the center-to-center distance between each sub-shifter, which is formed between isolated patterns, and the isolated pattern exceeds $1 \times II/NA$ and is less than $3.0 \ \lambda NA$.

To attain the above object, according to a fifteenth aspect of the invention there is provided a sub-shifter phase shift exposure method, which uses an exposure mask having isolated patterns and sub-shifters, which are provided around the isolated patterns to increase the resolution of the isolated pattern apertures, and in which a phase shift mask having a single sub-shifter formed between isolated patterns is used to reduce the exposure intensity peak between sub-shifters.

To attain the above object, according to a sixteenth aspect of the invention, in the exposure method according to the fifteenth aspect of the invention a phase shift mask, in which a sub-shifter is formed between isolated patterns close to each other by least by a predetermined distance has a small area compared to the other sub-shifters, and is used to reduce the exposure intensity peak between sub-shifters.

To attain the above object, according to a seventeenth aspect of the invention, in the exposure method according to the fifteenth aspect of the invention a phase shift mask, in which a sub-shifter formed between isolated patterns close to each other by at least a predetermined distance has a light permeability reduced compared to the other sub-shifters, is used to reduce the exposure intensity peak between sub-shifters.

According to an eighteenth aspect of the invention, in the exposure method according to the fourteenth to the seventeenth aspects of the invention a sub-shifter formed between isolated patterns close to each other by least by a predetermined distance is divided into a plurality of areas, said individual areas being deviated in phase relative to one another so as to reduce the intensity of the exposure light passing through said sub-shifter.

According to the first to the sixth aspects of the invention it is possible to eliminate mutual interference adjacent portions of edge patterns or sub-shifter patterns. This can be readily realized by rotating the pattern on one side or patterns on both sides by 45°. Further, when applied to the phase shift techniques, the phase sequence of one side pattern can be inverted to increase the effect of phase shift to thereby obtain a main peak of higher intensity.

According to the seventh to the eighteenth aspects of the invention, by providing a single sub-shifter between isolated patterns (i.e., central patterns), it is possible to reduce its influence as well as its area. Further by reducing the light permeability of the sub-shifter or by providing a sub-shifter in a different phase shift amount portion (for instance a portion with zero phase shift amount), it is possible to suppress the light intensity of the sub-shifters.

The above and other objects, features and advantages of the invention will become more apparent from the following detailed description of the preferred embodiments when the same is read with reference to the accompanying drawings.

DETAILED DESCRIPTION OF THE PREFERRED EMBODIMENTS

EMBODIMENT 1

This embodiment of the invention is applied to the sub-shifter type phase shift exposure technique. More specifically, it makes it possible to apply the sub-shifter type phase shift method to a vicinity pattern group as well, typically two contact hole patterns close to each other such that there is mutual interference of their sub-shifters, by rotating sub-shifter patterns (i.e., arranging the sub-shifters at an angle relative to one another). The embodiment will now be described with reference to FIG. 8.

Figure 1A:
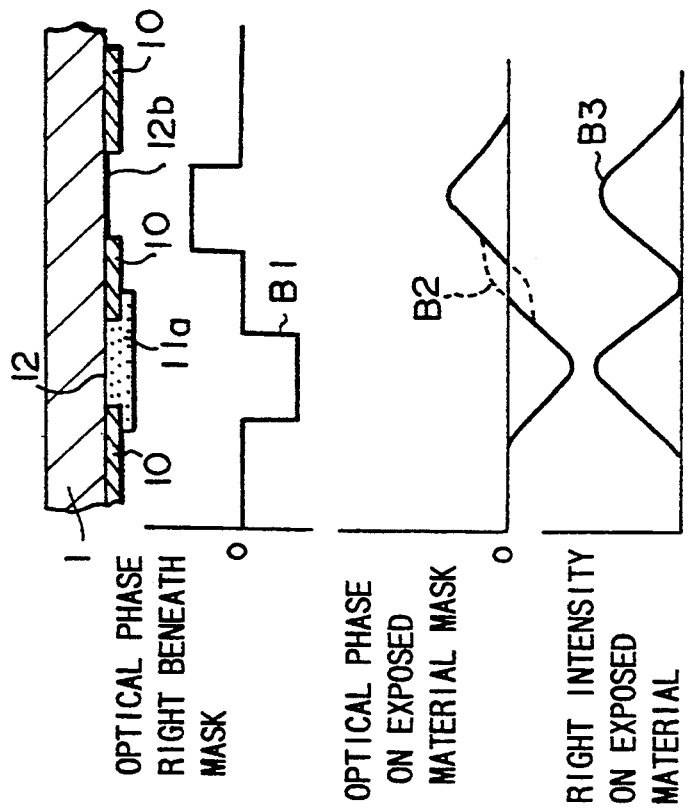
FIG. 1A and 1B is a view illustrating the principle of a phase shift mask.
Figure 1B:
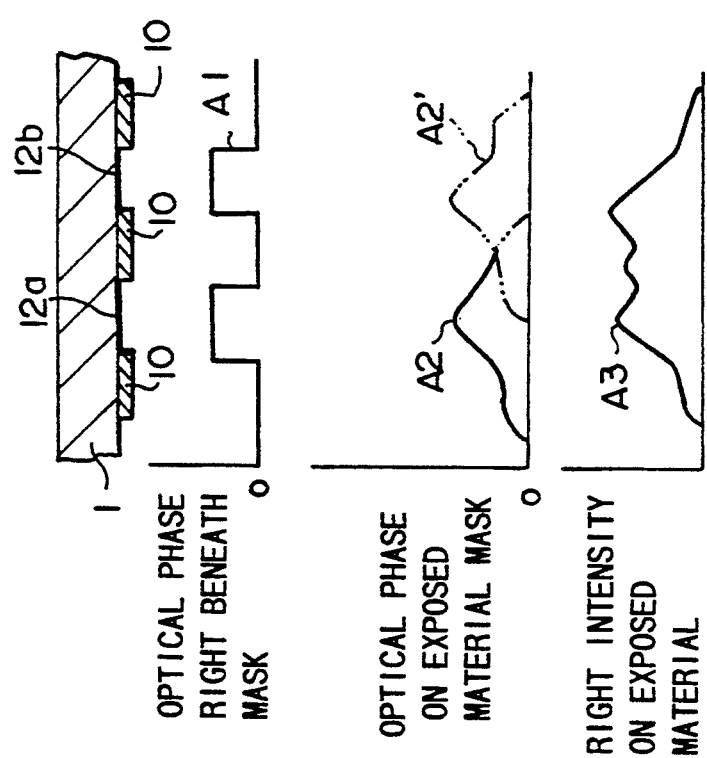
Figure 2A:
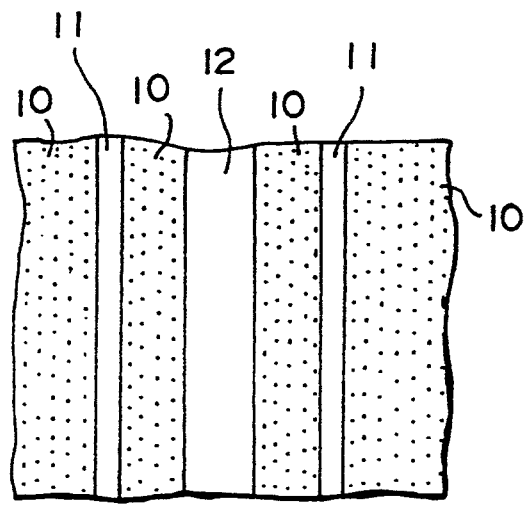
FIGS 2A and 2B is a view showing prior art phase shift masks.
Figure 2B:
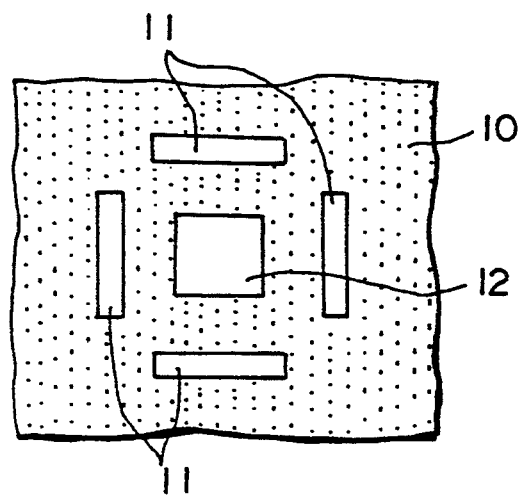
Figure 3:
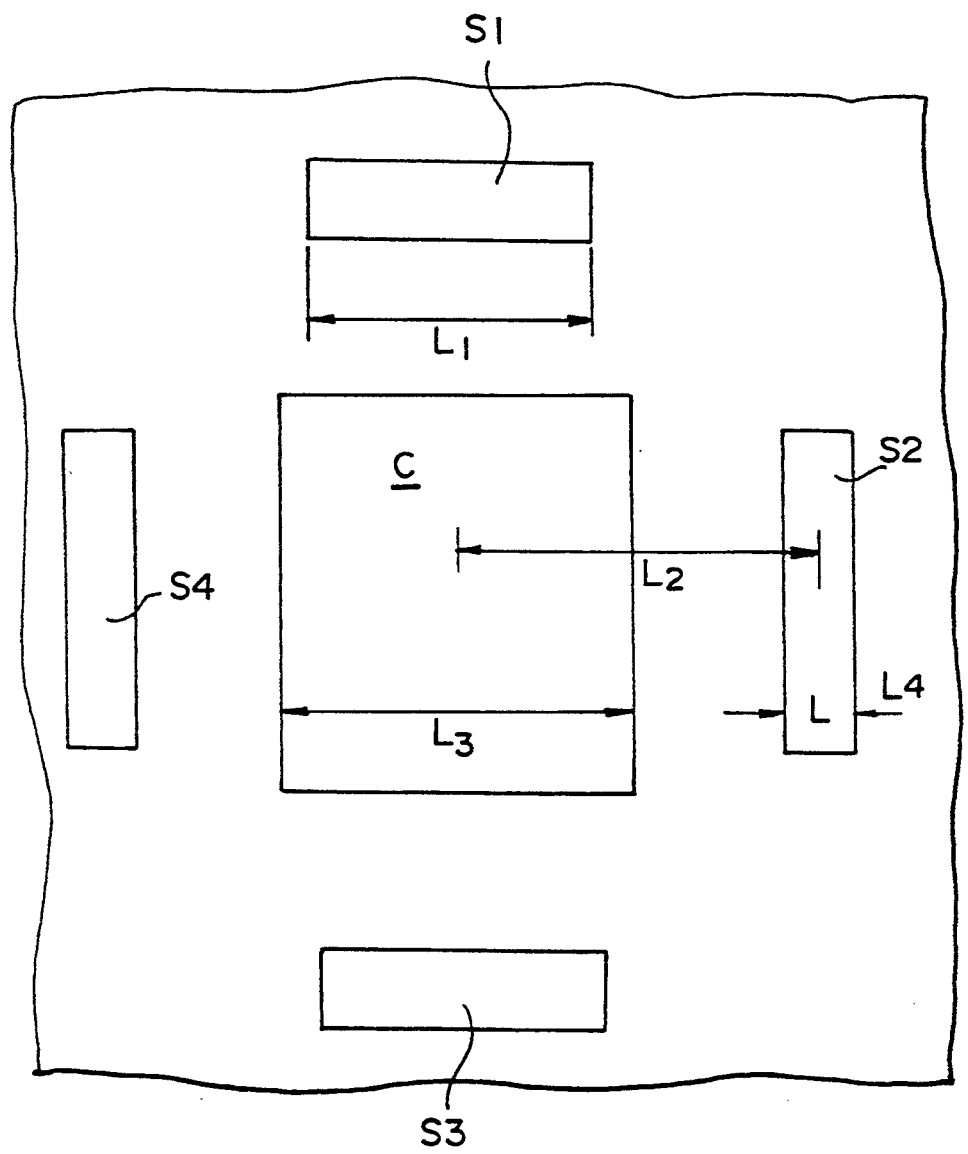
FIG. 3 is a view showing an optimum design (with i beam) of the prior art structure.
Figure 4:
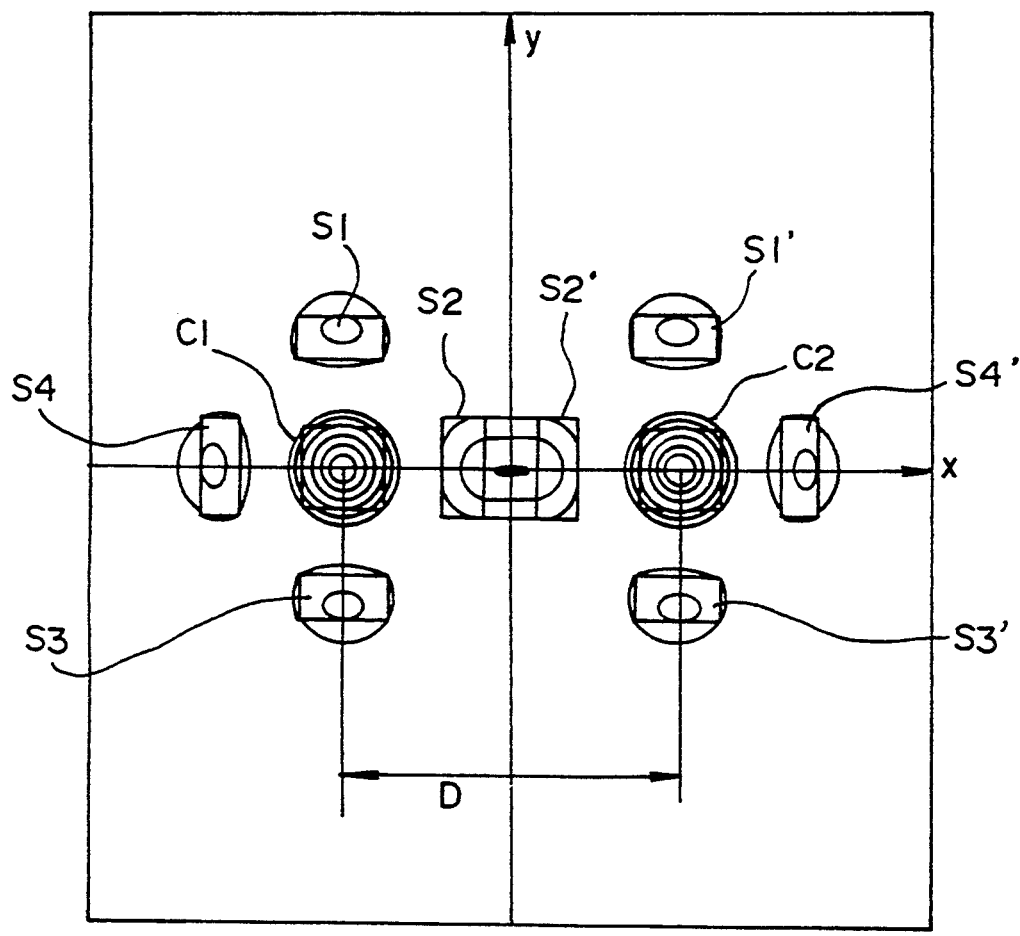
FIG. 4 is a view showing prior art light intensity contour lines.
Figure 5:
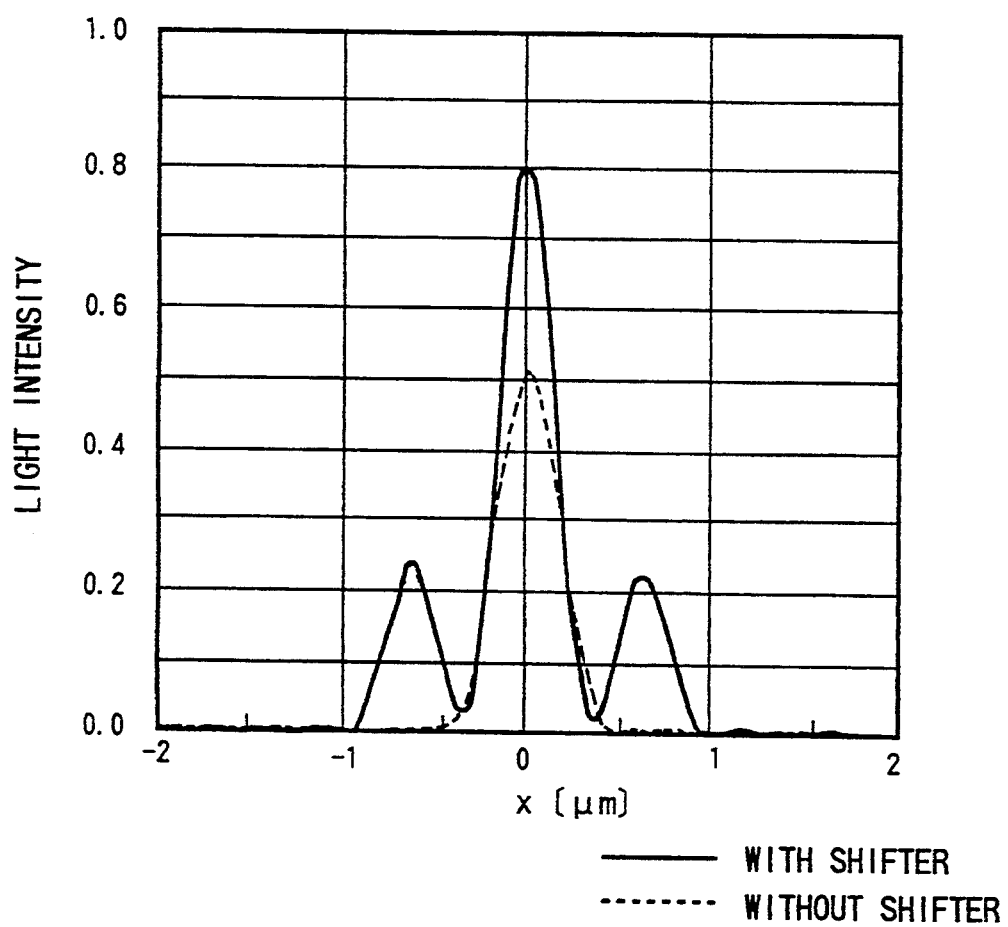
FIG. 5 is a graph showing light intensity distributions in the prior art.
Figure 6:
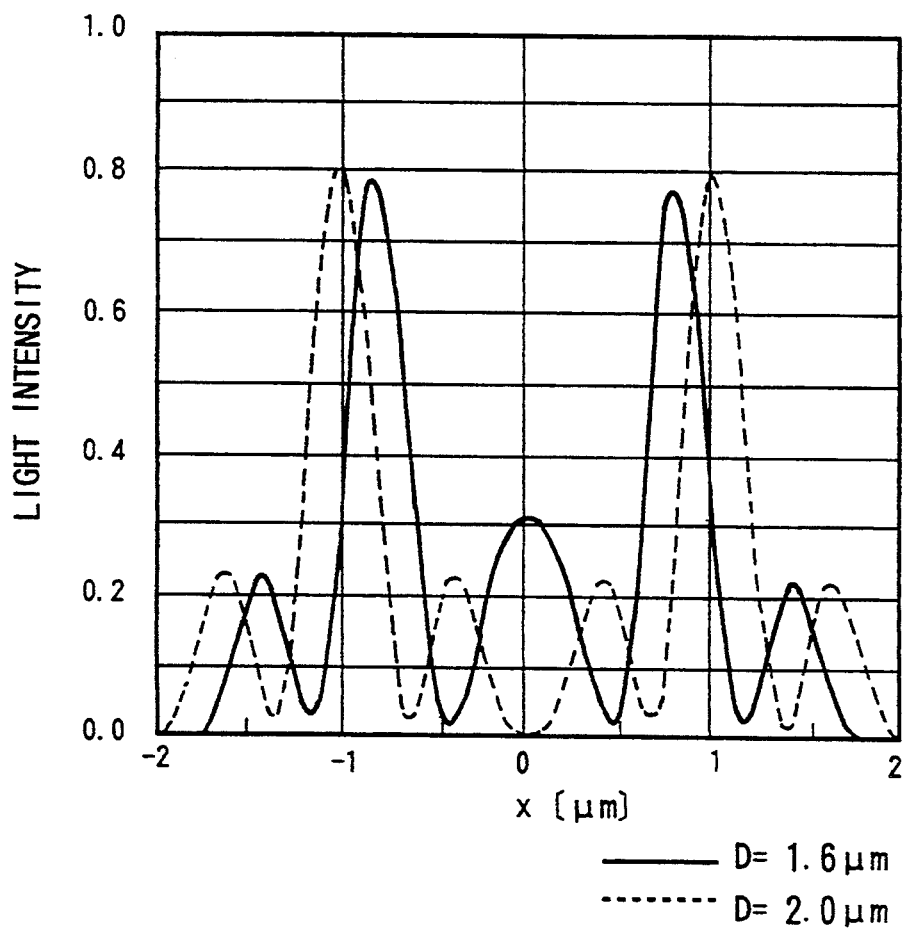
FIG. 6 is a graph showing light intensity distributions in the prior art.
Figure 7:
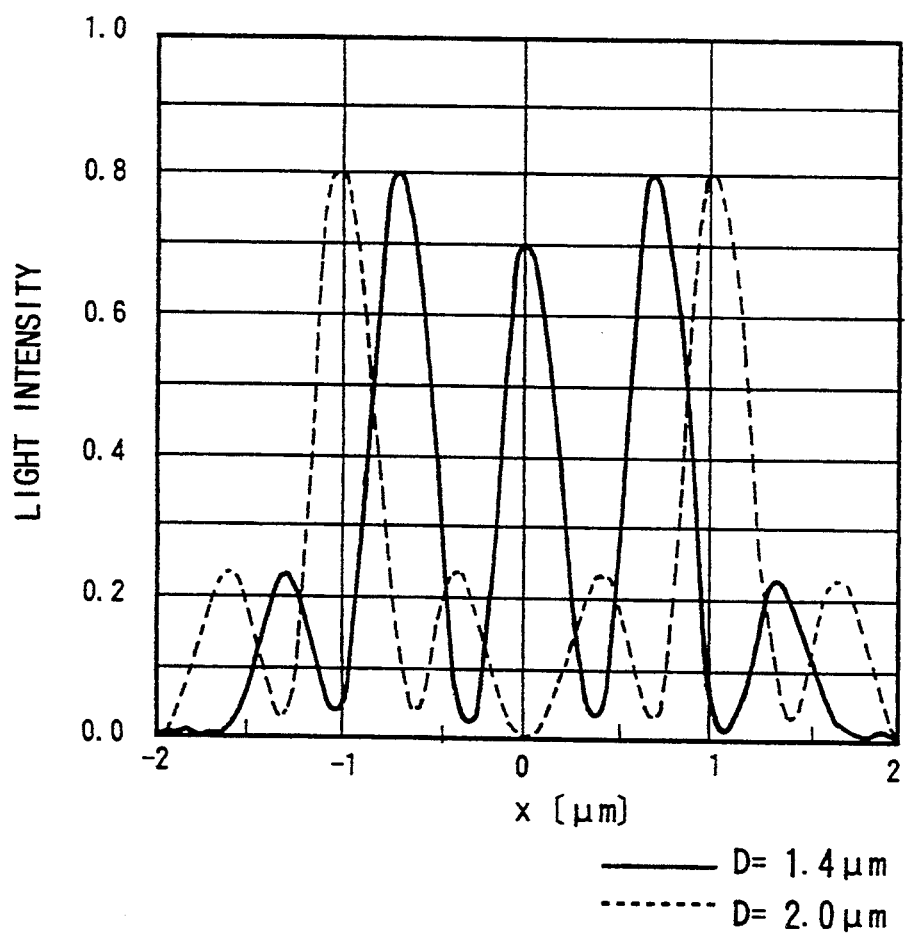
FIG. 7 is a graph showing light intensity distributions in the prior art.
Figure 8:
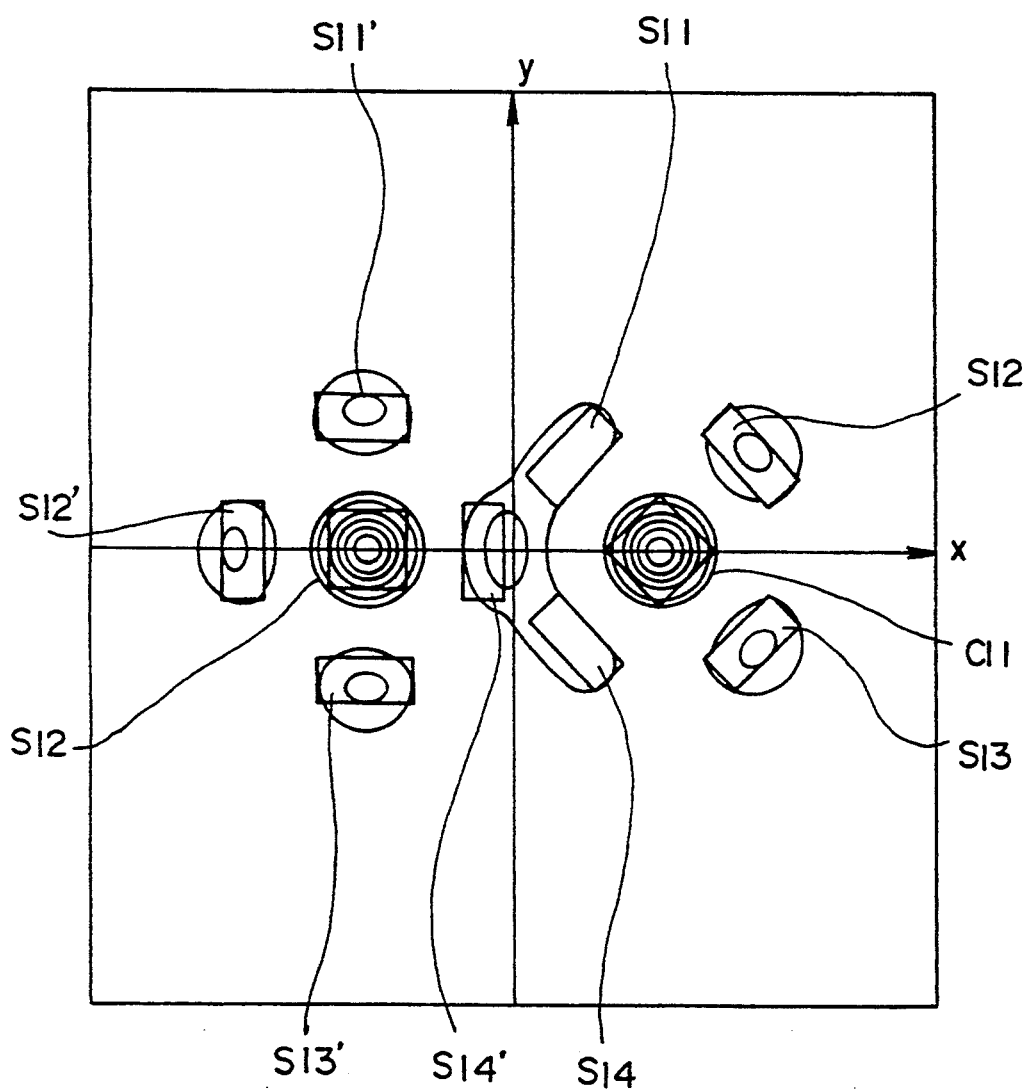
FIG. 8 is a view showing a pattern configuration and light intensity contour lines in Embodiment 1 of the invention.

FIG. 8 shows a pattern configuration, in which the sub-shifters in the right side pattern group are rotated by 45°. More specifically, sub-shifters S11' to S14' around a left side central pattern C12 are provided along the four sides thereof as in the prior art, but in the right side pattern group a central pattern C11 and sub-shifters S11 to S14 therearound are rotated by 45° relative to the left side group. In this case, the inter patterns are merged, but the pertinent intensity is 0.24 and is equal to the outside peak intensity. In this case, the main peak intensity was 0.78. Since the main peak intensity for the case which provides a sufficient distance to eliminate the interference effect was 0.80, this method of arrangement permits reduction of the main peak intensity by 0.02 and a reduction of the merged peak intensity by 0.47.

EMBODIMENT 2

Figure 9:
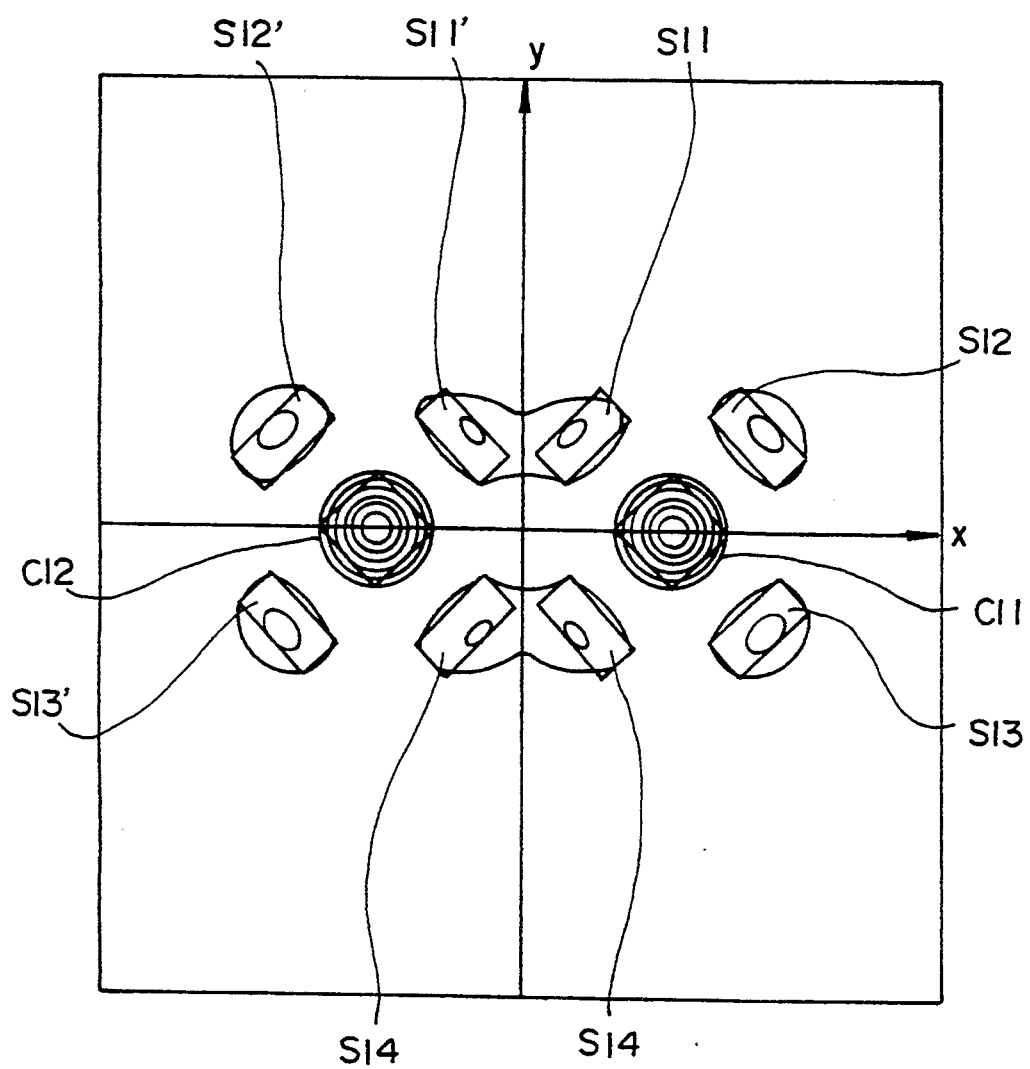
FIG. 9 is a view showing a pattern configuration and light intensity contour lines in Embodiment 2 of the invention.

This embodiment is an improvement over Embodiment 1. More specifically, the left side pattern group (i.e., central pattern C12 and sub-shifters S11' to S14'), are also rotated by 45°. FIG. 9 shows the arrangement in this case.

With this arrangement, the main peak intensity is not changed, and only the merged peak intensity can be reduced. It is thus possible to reduce the adverse effect of interference very effectively.

EMBODIMENT 3

In this embodiment, the sequence of arrangement of sub-shifter arrangement is changed to permit the application of the sub-shifter type phase shift method to a vicinity pattern group as well.

Figure 10:
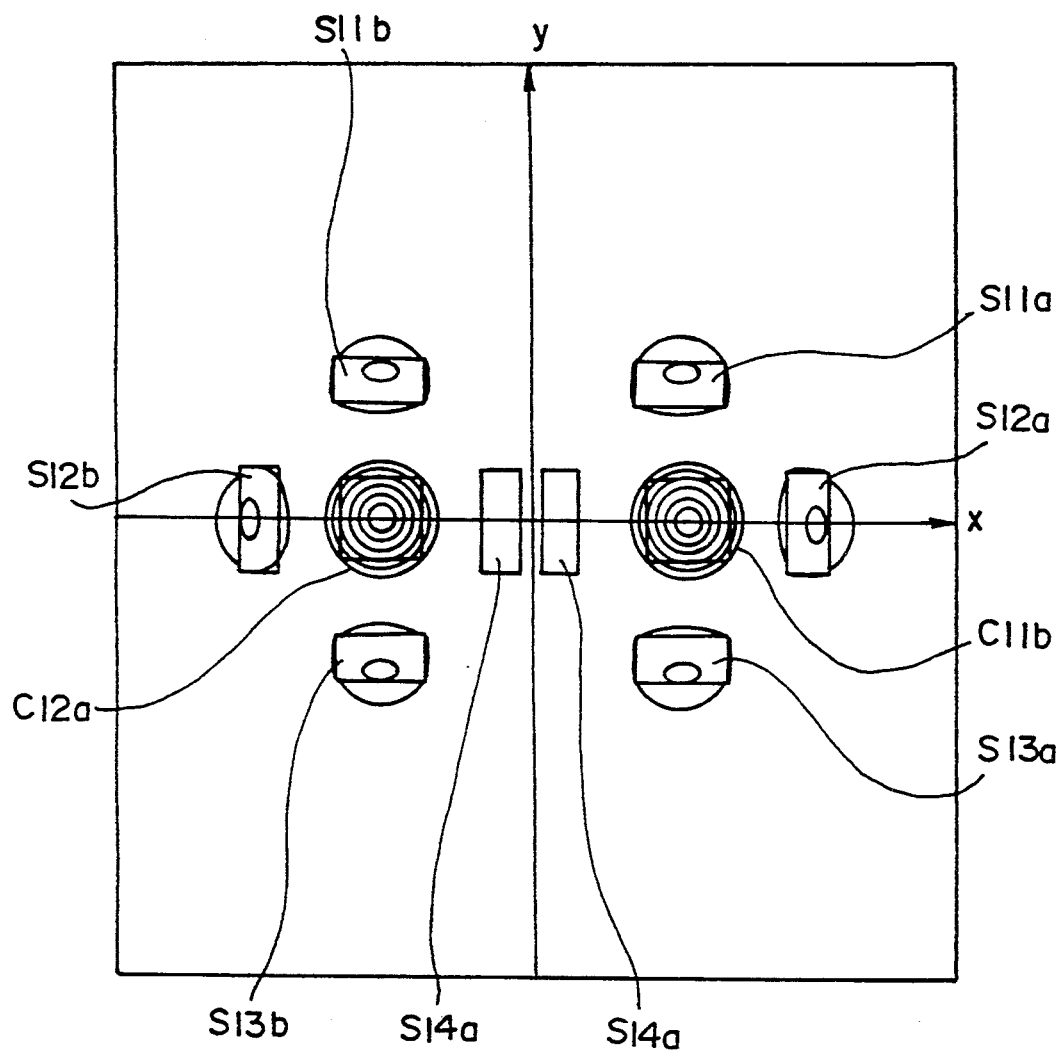
FIG. 10 is a view showing a pattern configuration and light intensity contour lines in Embodiment 3 of the invention.

More specifically, instead of rotating the patterns, the sequence of arrangement of sub-shifters is changed to effectively utilize the vicinity inteference effect. This is shown in FIG. 10.

Figure 11:
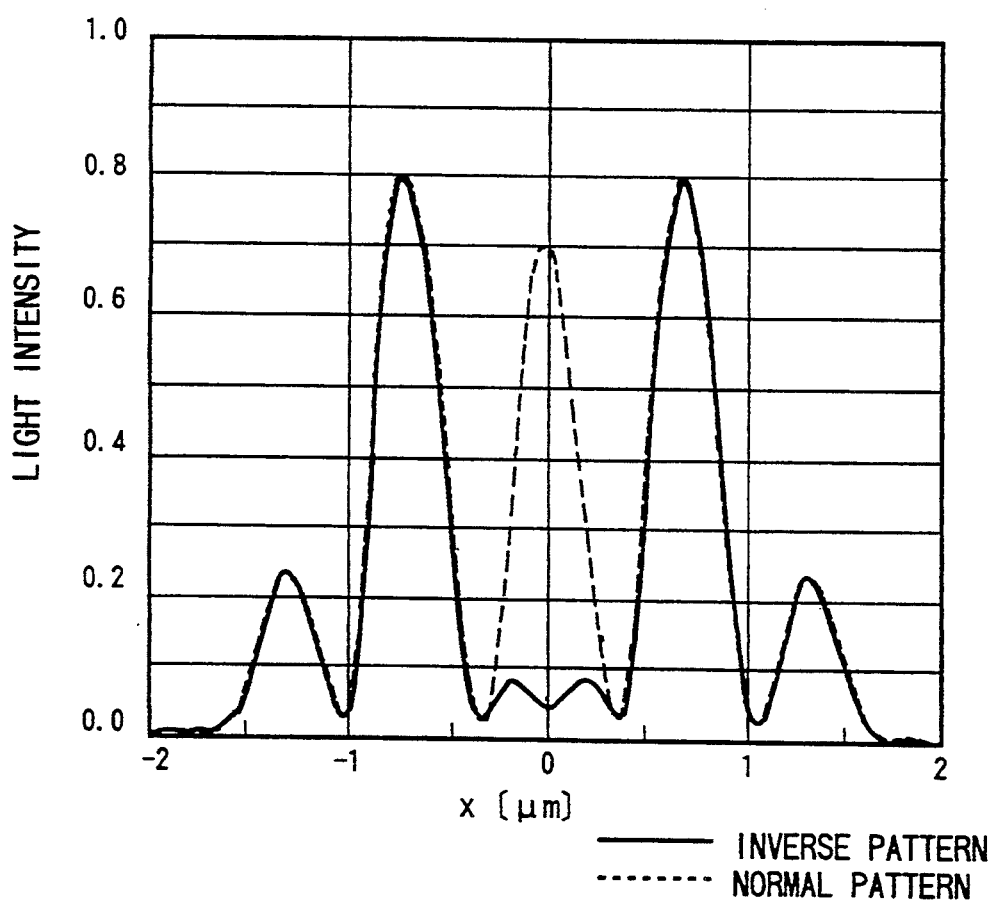
FIG. 11 is a graph showing light intensity distributions in Embodiment 4 of the invention in case of y=0.

As shown, in the left side pattern group the phase, shift amount is set to 0° for a central pattern C12a and to 180° for sub-shifters S11b to S11b around the central pattern. In the right side pattern group, on the other hand, the phase relation is inverted between 0° and 180°, that is the phase shift amount is set to 180° for sub-shifter patterns S11a to S14a and to 0° for a central pattern C11b. FIG. 11 shows the light intensity distributions in this case. It will be seen from FIG. 11 that with this method it is possible to substantially perfectly eliminate the peak that might otherwise be formed between two holes. Further, the main peak intensity is 0.81, which is an increase as compared to the usual method.

The above Embodiments 1 to 3 are concerned with the formation of contact holes of 0.40 micron by using an i beam. However, the conditions for each structure are by no means limitative, and the light source wavelength, and other parameters may be varied within the range of the invention.

EMBODIMENT 4

Figure 12:
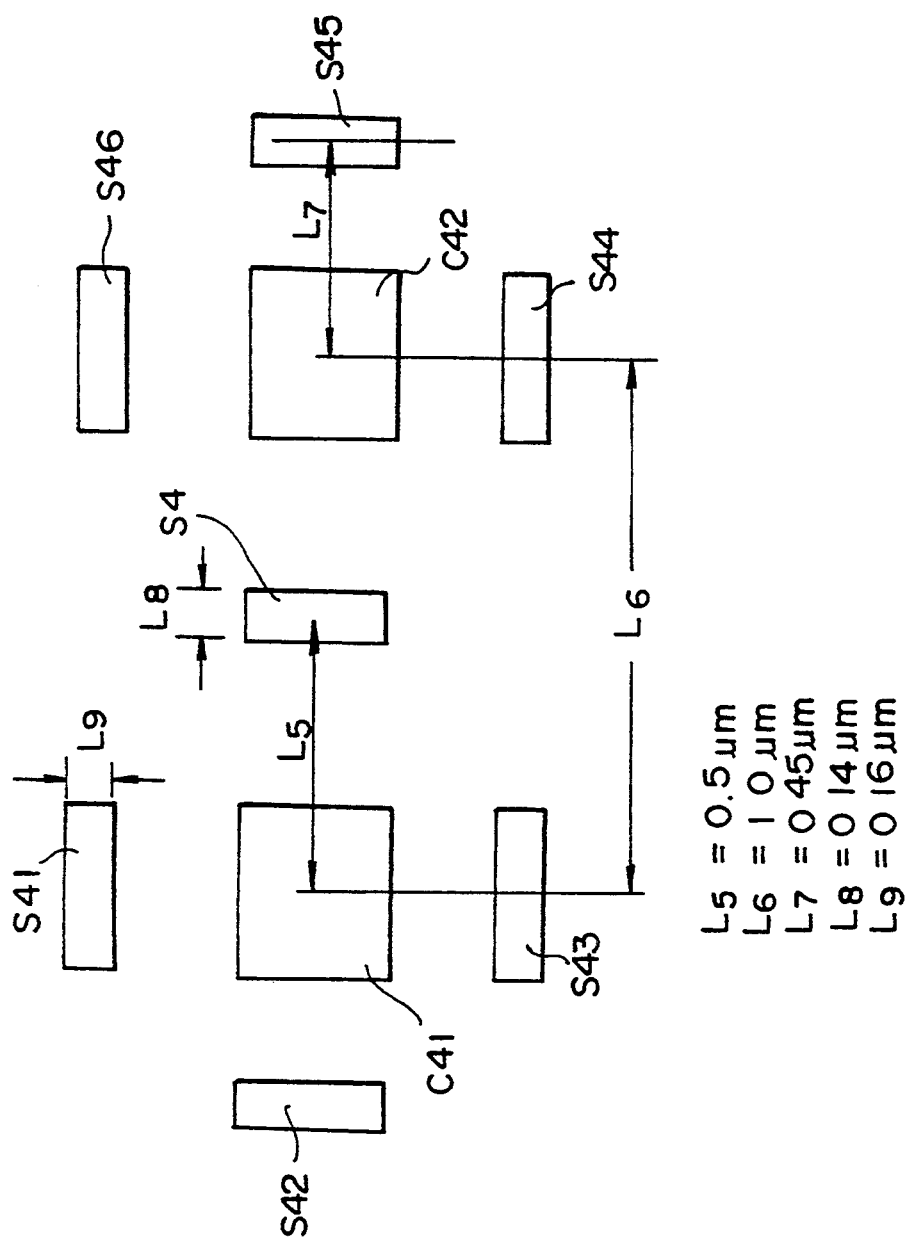
FIG. 12 is a view showing a mask in Embodiment 4.

In this embodiment, as shown in FIG. 12, a single sub-shifter S4 is provided between isolated patterns C41 and C42.

More specifically, this embodiment concerns a sub-shifter phase shift exposure mask used for a sub-shifter phase shift method, which uses an exposure mask having isolated patterns C41 and C42 and sub-shifters S4 and S41 to S46, which are provided around the isolated patterns for increasing the resolution of the apertures of the isolated patterns C41 and which C42 and are not resolved themselves. The isolated patterns C41 and C42 are close to each other by at least a predetermined distance, and the single sub-shifter S4 is formed between the isolated patterns C41 and C42.

In this embodiment, denoting the exposure wavelength by $\lambda$ and the aperture of the exposer by NA the center-to-center distance L5 between the sub-shifter S4, which is formed between the isolated patterns C41 and C41, and each of the isolated patterns C41 and C42 is in a range of $0.75 \times \lambda/NA$ and $1.0 \times \lambda/NA$. Specifically, in the case of exposure with a KrF eximer laser beam (with a wavelength of 248 nm) the distance $L_5$ is set to 1 micron.

In this embodiment, the sub-shifter S4 formed between the isolated patterns C41 and C42 is set to have an area which is smaller as that of other sub-shifters S41 and S46. Specifically, the sub-shifter width is set to 0.14 micron for the sub-shifter S4 between the isolated patterns C41 and C42 and to 0.16 micron for the other sub-shifters S41 to S46. By setting a smaller area for the sub-shifter S4 between the isolated patterns C41 and C42 it is possible to suppress the amount of light transmitted through the sub-shifter S42, thus preventing resolution by the sub-shifter S42.

Figure 14:
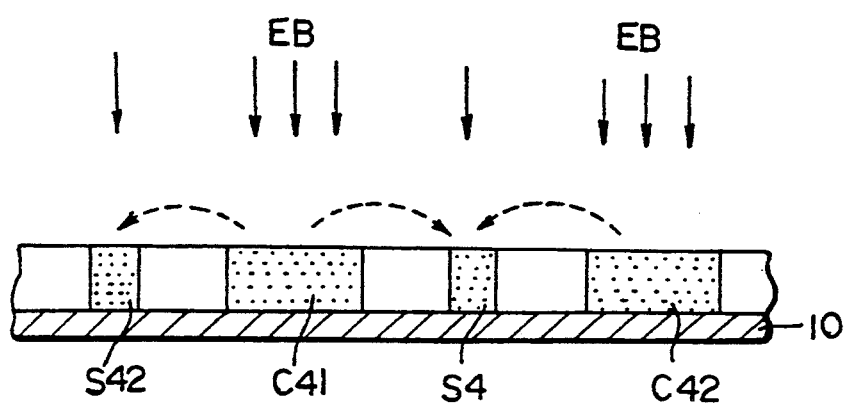
FIG. 14 is a view for explaining vicinity effect.

The embodiment will now be described in further detail. The exposure mask in this embodiment is designed on the basis of the following concept. A case will now be considered, in which a sub-shifter (auxiliary shifter) is disposed in contact holes of 0.4 micron for exposure with a KrZ eximer laser (of 248 nm). For the sake of the brevity, two isolated patterns C41 and C42 are assumed as hole patterns. Generally, the distance $L_5$ between the auxiliary shifter and the hole and the distance $L_6$ between the two holes, when normalized in $\lambda/NA$, are said to be 0.7 to $0.8 \times \lambda/NA$ and $2.5 \times \lambda/NA$, respectively. Thus, by designing the device such that the inter-hole distance is 1.4 to $1.6\lambda/NA$ and arranging a single sub-shifter between the holes, the inter-hole distance may be made considerably small compared to $2.5 \times /NA$. In this case, however, in the intermediate sub-shifter S4 the intensity is increased compared to the other shifters S41 to S46 due to the interference of light transmitted through the sub-shifter and diffracted light from the opposite side holes as mentioned before. Further, as shown in FIG. 14, with a mask there is a vicinity effect influence (i.e., increase of energy in the central sub-shifter S4 due to the influence of the opposite side patterns C41 and C46. The greater the sub-shifter width, the greater is the phase shift effect. However, if the width is excessive, the resist is revolved. For this reason, the resolution limit is desired. However, if the sub-shifters S41 to S46 are designed with the limit, the sub-shifter S4 is resolved.

In this embodiment, accordingly, the intermediate sub-shifter S4 is formed such that it is small compared to the other sub-shifters S41 to S46, thus reducing the light intensity in this portion.

Figure 13:
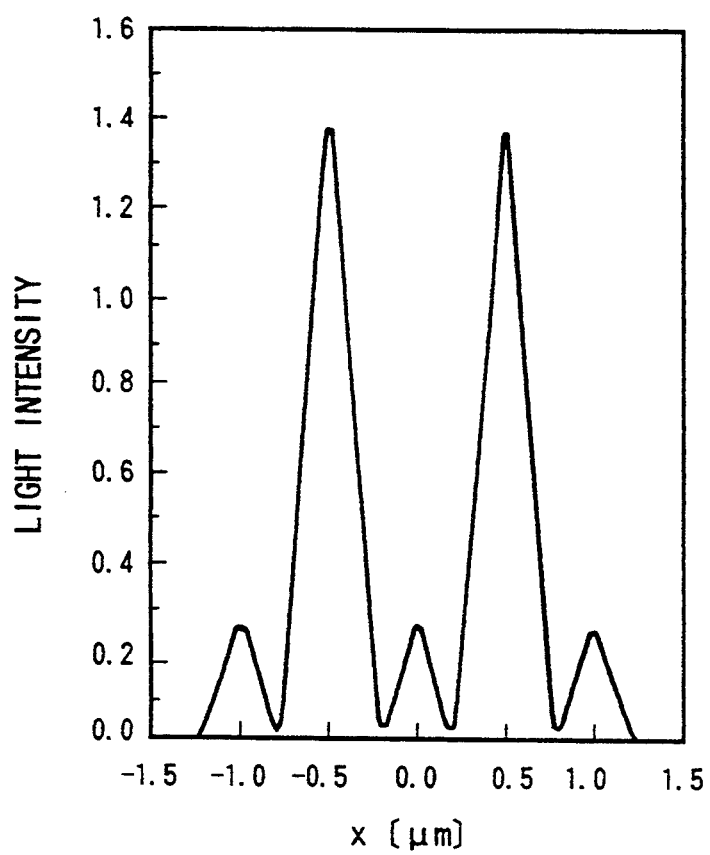
FIG. 13 is a view showing a light intensity distribution in Embodiment 4.

FIG. 13 shows the result of simulation carried out by setting the width of the sub-shifter S4 to 0.14 micron. With this arrangement, the light intensity of the sub-shifter S4 can be held to be substantially of the same order as the other sub-shifters S41 to S46. Besides, the intensity of the central hole patterns (i.e., isolated patterns C41 and C42) is not substantially affected.

Actually, in the EB drawing of a mask pattern the vicinity effect as described before in connection with FIG. 14 is provided. It is thus desirable to design the sub-shifter line width to be smaller when inputting drawing CAD data.

EMBODIMENT 5

In this embodiment, the exposure light permeability of sub-shifter S4 formed between isolated patterns C41 and C42 is set to be low compared to the other sub-shifters, thus obtaining the same effects as in Embodiment 4. This embodiment has the same mask pattern arranngement as in FIG. 12. However, the area of the intermediate sub-shifter S4 is set to be equal to those of the other sub-shifters S41 to S46, while setting the light permeability of the sub-shifter S4 to be 80 %.

Figure 15:
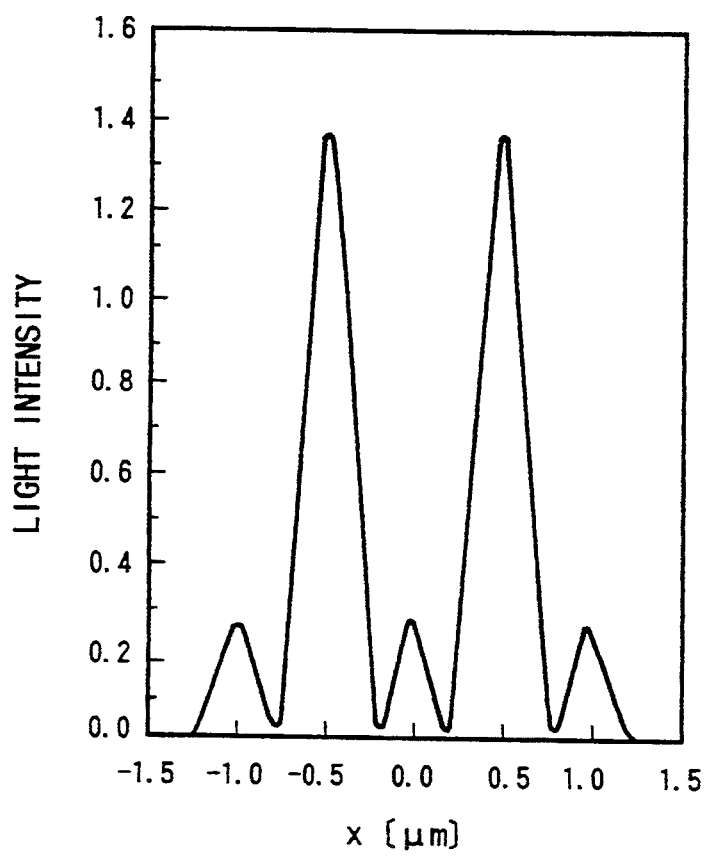
FIG. 15 is a view showing a light intensity distribution in Embodiment 5.

By reducing the light permeability of the sub-shifter S4 the same effect as in the case of the area reduction is obtainable. FIG. 15 shows the result of simulation in a case where the light permeability of the intermediate sub-shifter is set to 80%.

The light permeability of a specific sub-shifter may be conveniently reduced by ion implantation. It is well known that the reduction of the light permeability with Ga ion implantation is obtainable by using a $SiO_2$ type material such as SOG for the sub-shifter. Further, it is possible to adopt implantation of other kinds of ions for the light permeability reduction.

EMBODIMENT 6

Figure 16:
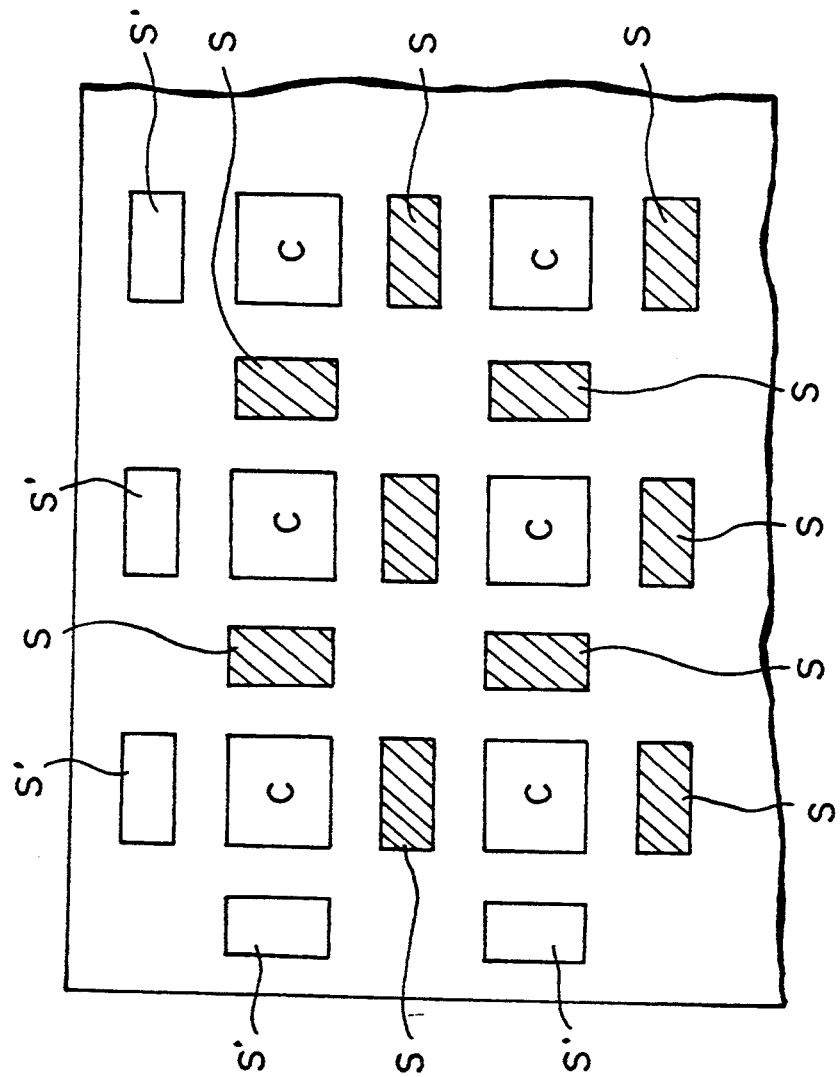
FIG. 16 is a view showing a mask in Embodiment 6.

The above Embodiments 4 and 5 are applicable to cases where there is at least one pattern with two holes close to each other such that only a single intermediate sub-shifter can be provided. However, where device elements are arranged in a checkerboard fashion as shown in FIG. 16, there exists a sub-shifter, which influences only a single hole (such as white sub-shifters S' in FIG. 16), at an end edge of the device. Thus, by reducing the area or light permeability of the other sub-shifters, i.e., sub-shifters S (as shown shaded) provided between adjacent isolated patterns, it is possible to obtain the desired effect. In FIG. 16, the sub-shifters S shown shaded are each common to two hole patterns, while each edge sub-shifter S' has influence for only a single hole.

EMBODIMENT 7

Figure 17:
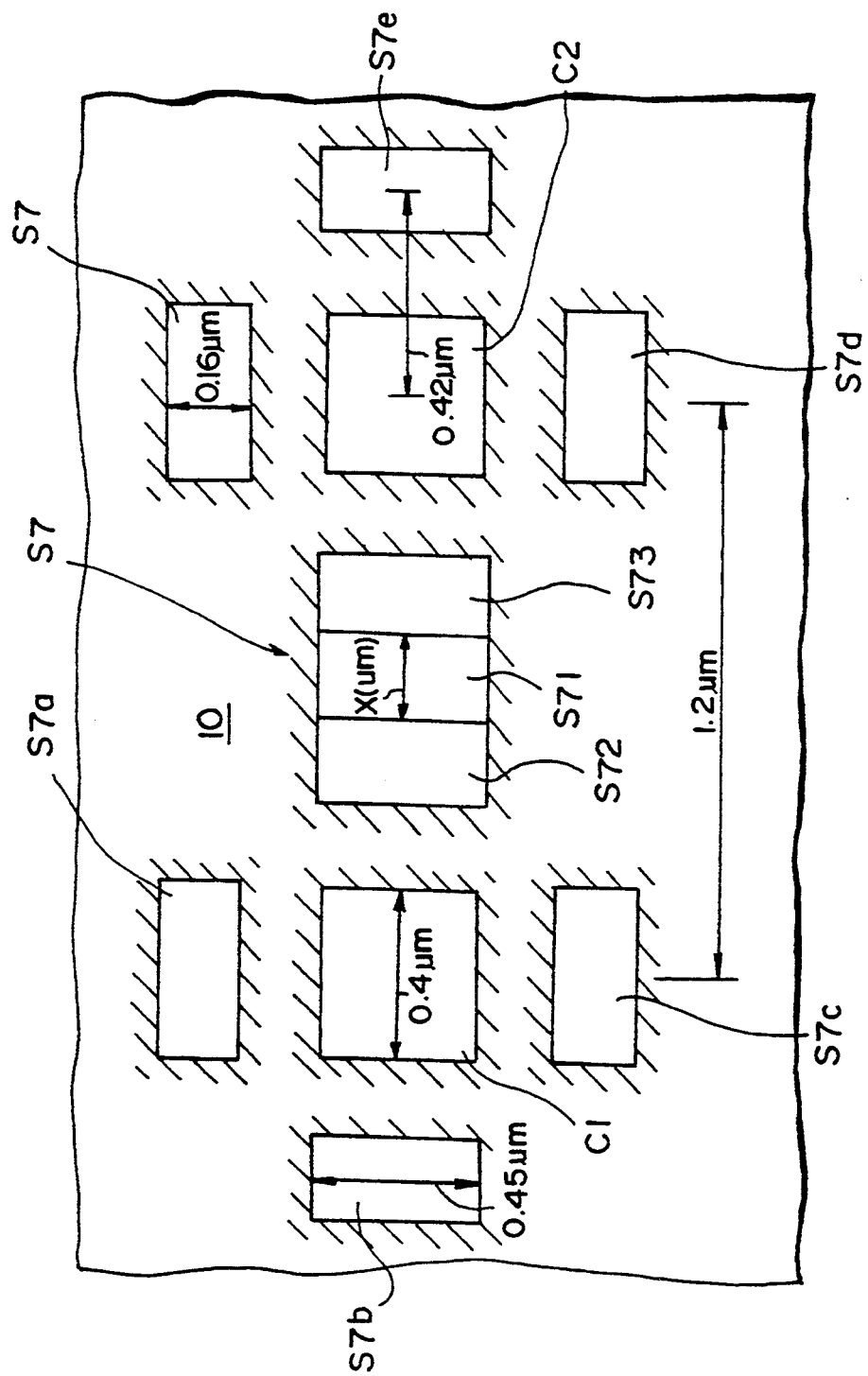
FIG. 17 is a view showing a mask in Embodiment 7.
Figure 19:
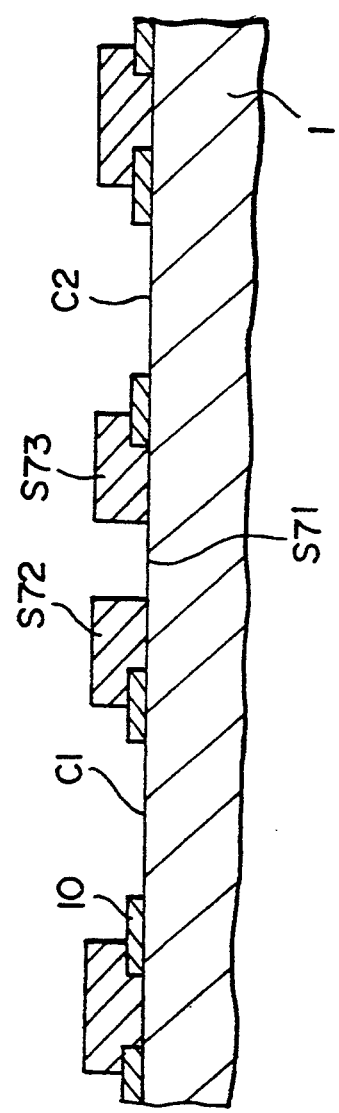
FIG. 19 is a sectional view showing a mask in Embodiment 7.

In this embodiment of the phase shift exposure mask, as shown in FIG. 17, a sub-shifter S7 between two isolated patterns S72 and C72 is formed with a central shifter-free portion S71 and has an aperture. FIG. 19 shows a sectional view of this exposure mask.

Specifically, this embodiment is applied to a sub-shifter phase shift exposure mask used for a sub-shifter phase shift method, which uses an exposure mask having isolated patterns C1 and C2 and sub-shifters S7 and S7a to S7f, which are provided around the isolated patterns C1 and C2 to increase the resolution of the apertures of the isolated patterns. A single sub-shifter S7 is formed between and so as to be common to the isolated patterns C1 and C2 which are closest to each other. The sub-shifter S7 is divided into a plurality of areas S71 to S73, and the individual division areas are shifted in phase. Particularly, the phase shift amount of the central portion S71 of the sub-shifter S7 is set to be zero. The opposite side portions S72 and S73 are shifted in phase by 180°.

Figure 18A:
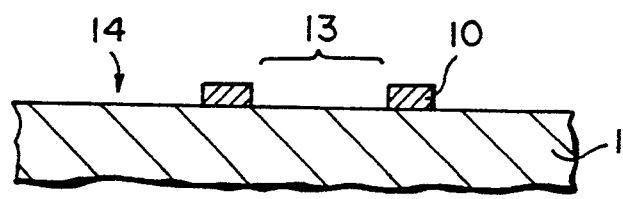
FIG. 18A to 18D is a view illustrating steps of manufacture of a mask in Embodiment 7.
Figure 18B:
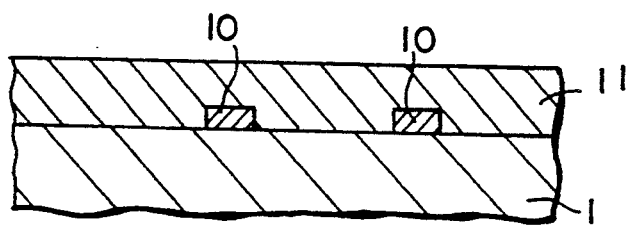
Figure 18C:
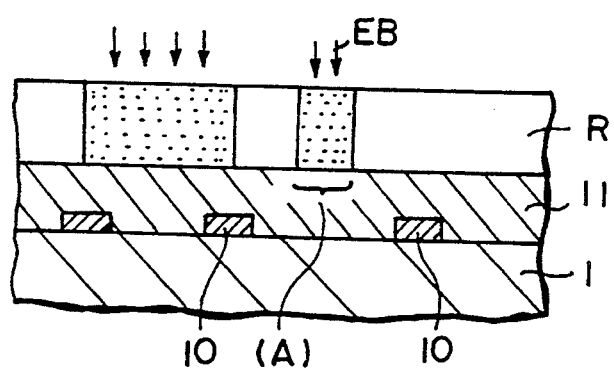
Figure 18D:
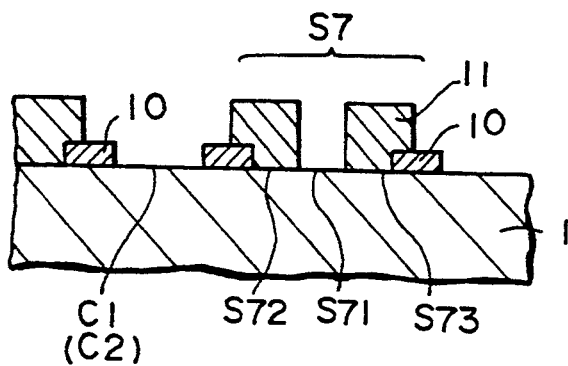

The phase shift exposure mask in this embodiment is formed as follows. As shown in FIG. 18(a), a Cr pattern constituting light-blocking portions 10 is first formed on a substrate 1 (of quartz) by the usual mSK EB drawing. Then, as shown in FIG. 18(b), SOG is applied as a phase shift material 11, and then a resist R is coated as shown in FIG. 18(c). Then, a sub-shifter pattern EB is made (see FIG. 18(c). In this case, as the resist is used is one of a positive type, for instance "EBR-9" (a trade name), and as SOG there is used, for instance, "Accuglass X-211" (a trade name, by Allied Signal Incorporated). In this embodiment, a portion A in FIG. 18 is also exposed to remove the resist, thus forming the sub-shifter S71 with zero phase shift. Subsequently, a SOG pattern is formed by dry etching, whereby the structure as shown in the sectional view of FIG. 19 is obtained.

A case for carrying out exposure by using this exposure mask will now be considered. As an example, a KrF eximer laser (248 nm) was used as the light source, NA was set to NA=0.42, square isolated patterns (Holes) with one side of 0.2 micron as shown in FIG. 17 were formed, the inter-hole distance was set to 1.2 microns, the sub-shifter width was setto 0.16 microns, and the width of the central zero phase portion S7 was set to 0.14 microns.

Figure 20:
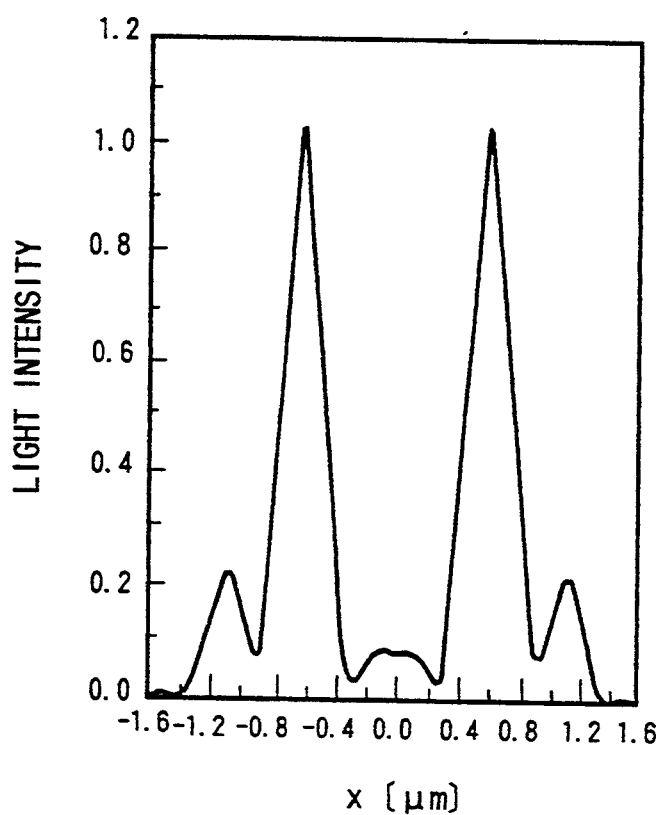
FIG. 20 is a view showing a light intensity distribution in Embodiment 7.

FIG. 20 shows the light intensity distribution on resist (i.e., simulation result) in this case. It will be seen that unlike the prior art, the central peak is reduced, thus providing no substantial influence on the intensity distribution in the hole portion and showing the effectiveness of the zero phase portion in this embodiment.

Figure 21A:
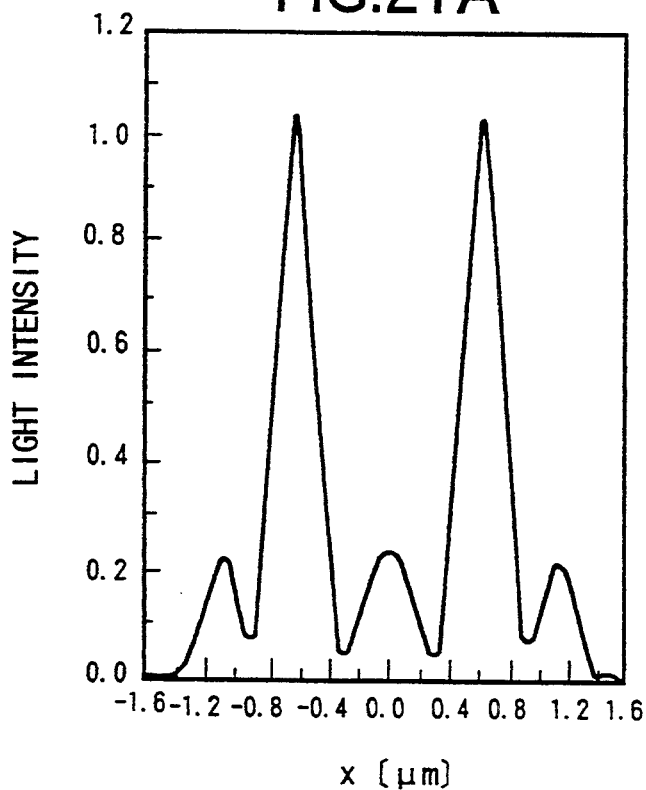
FIGS. 21A and 21B is a view showing light intensity distributions when the sub-shifter width is changed due to deviation in Embodiment 7.
Figure 21B:
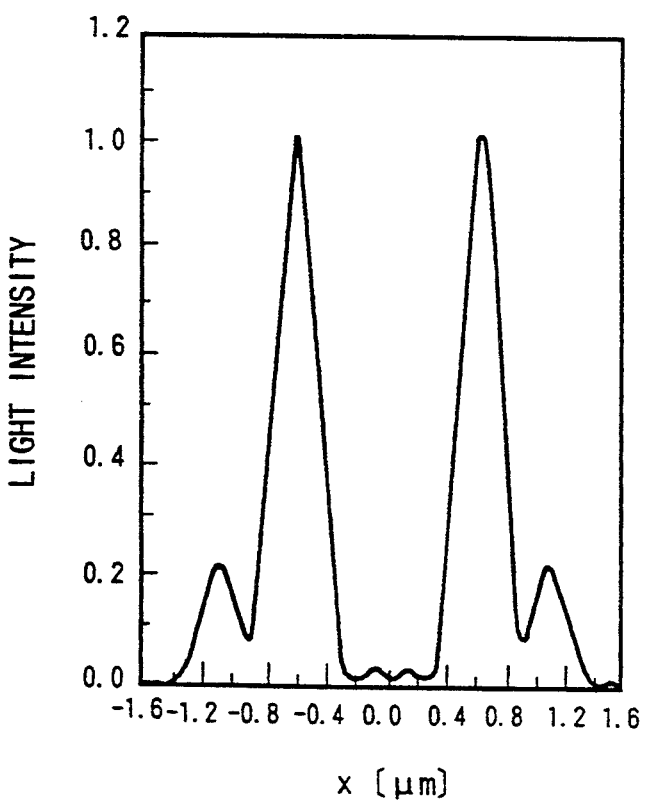

While in this embodiment the sub-shifter width was set to 0.14 microns (0.7 micron on the mask), actually a deviation is produced due to the vicinity effect at the time of the EB drawing and the conversion difference at the time of the SOG etching. FIGS. 21(A) and 21(B) show intensity distributions when the sub-shifter width is changed to 0.16 and 0.12 micron, respectively, due to deviation. In either case, there is no substantial influence on the hole intensity distribution. In addition, the inter-hole intensity does not exceed the intensity of the other sub-shifters. Even if there is a dimensional deviation, it has no influence on the effect. It is thus possible to obtain improved devices.

Figure 22:
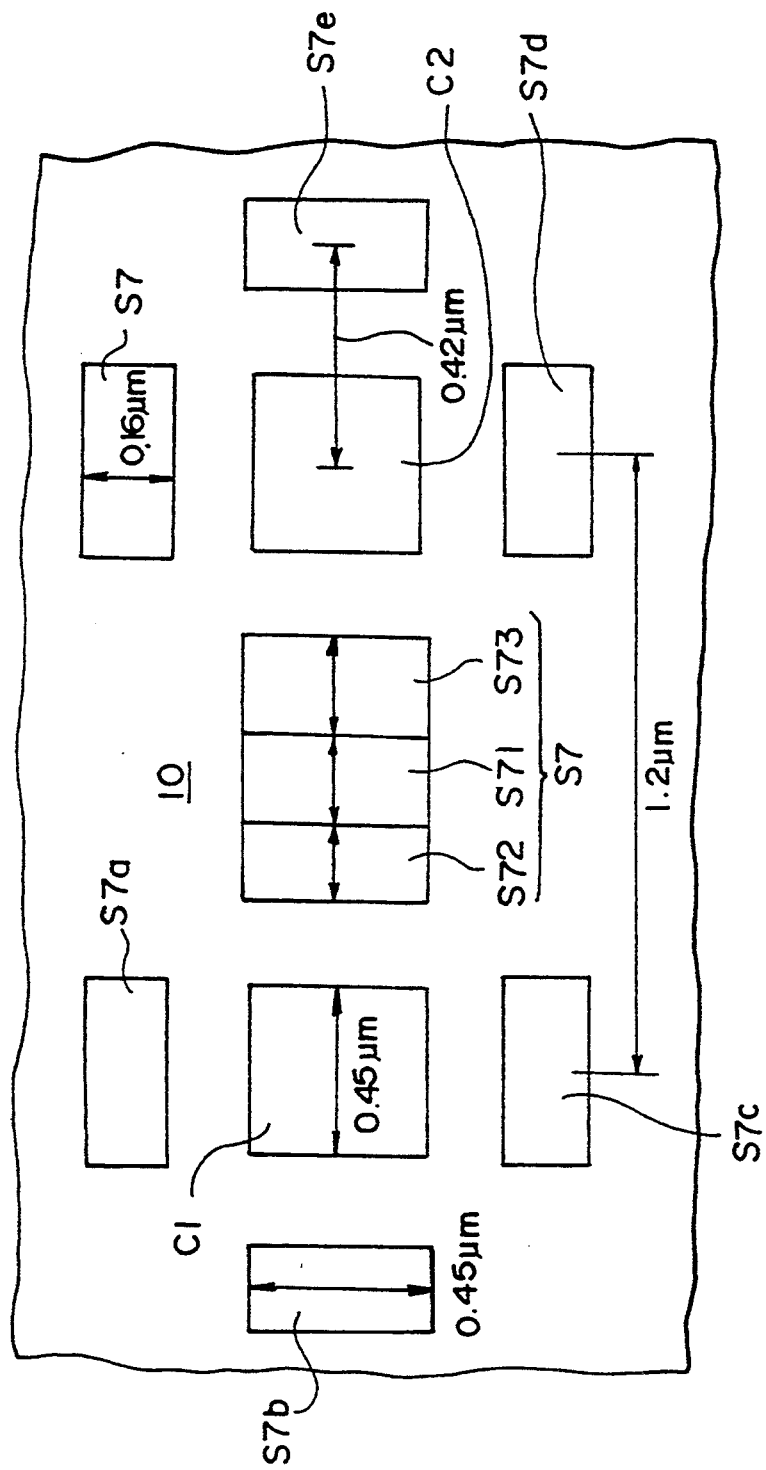
FIG. 22 is a view showing a case deviation from alignment of the mask in Embodiment 7.
Figure 23:
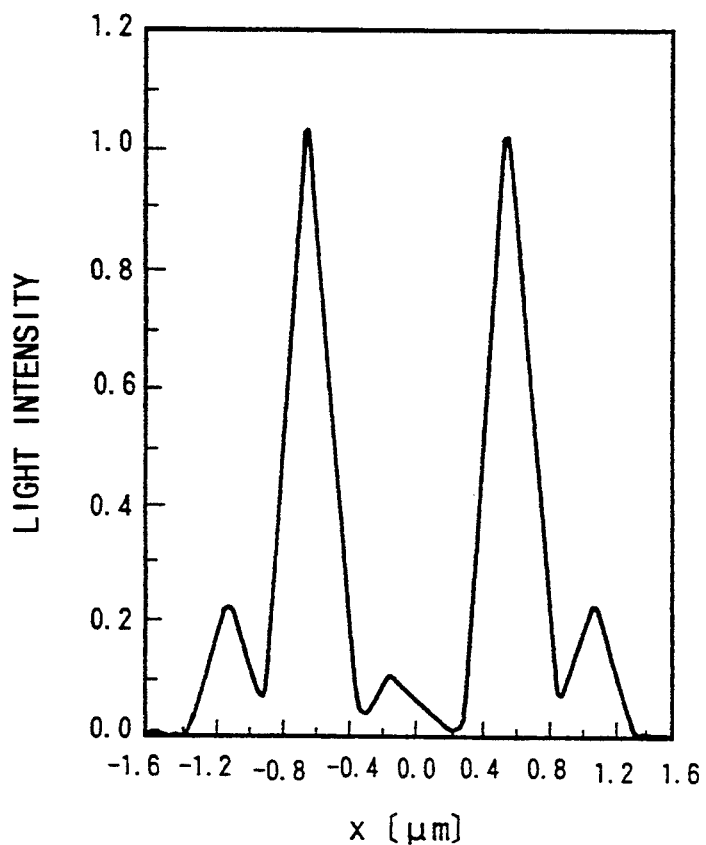
FIG. 23 is a graph showing the light intensity distribution of the mask in FIG. 22 in case of a deviation from the alignment.

A case of deviation from alignment will now be considered. In the case when there is alignment deviation of the EB drawing forming a 0° phase portion S71, as shown in FIG. 22, in which 180° phase portion S72, 0° phase portion S71 and 180 degree phase portion S73 in the central sub-shifter S7 are 0.14, 1.14 and 0.18 micron, respectively, and light intensity distributions are obtained. The results are as shown in FIG. 23. There is no problem of a sub-peak. Also, there is no substantial intensity difference between the opposite side apertures. Thus, the invention is applicable in cures where there are alignment deviation, which is very advantageous.

It will be seen that this embodiment permits reduction of the distance between adjacent isolated patterns down to 2.0×λ/NA. The lower limit, although depending on the performance and wavelength of the EB drawer, is thought to be about 1.0×λ/NA.

EMBODIMENT 8

Figure 24:
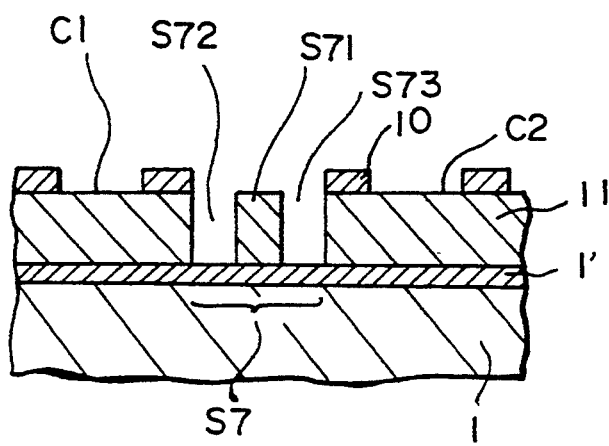
FIG. 24 is a view showing a phase shift mask in Embodiment 8.

While the above Embodiment 7 is applied to a commonly termed upper sub-shifter type exposure mask, this embodiment is applied to a lower sub-shifter type structure as shown in FIG. 24.

In this embodiment of the phase shift exposure mask, isolated patterns C1 and C2 are formed as phase shifters (with phase shift amount of 180 degree), and a sub-shifter S7 is formed between and such as to be common to the two patterns C1 and C2. The sub-shifter S7 is divided into a plurality of areas S71 to S72. Here, specifically the phase shift amount of the central portion S71 of the sub-shifter S7 is set to 180°, and those of the opposite side portions S72 and S73 are set to zero.

In this embodiment, the same effects as in Embodiment 7 can be obtained. That is, it is possible to reduce the inter-hole distance, thus greatly increasing the design freedom.

According to the invention it is possible to suppress and reduce adverse effects of the mutual interference of edge patterns (sub-shifters even with a pattern group, which has a central pattern (i.e., isolated patttterns) and edge patterns (i.e., sub-shifters) provided therearound.

What is claimed is:

1. A phase shift mask which is used for a lithographic process of transferring a pattern, said mask comprising:
   a light-blocking resist film formed on a substrate by controlling the amount of transmission of an exposing light;
   a first and a second light transmitting region formed adjacent to one another on said resist film for transmitting exposure light;
   a first auxiliary light transmitting region constituted by a first auxiliary light transmitting portion formed around said first light transmitting region on said substrate so as to have a long side direction so as to increase the resolution of said first light transmitting region; and
   a second auxiliary light transmitting region constituted by a second auxiliary light transmitting portion formed around said second light transmitting region on said substrate so as to have a long side direction to increase the resolution of said second light transmitting region;
   exposing light transmitted through said first and second light transmitting regions having different phases from exposing light transmitted through said first and second auxiliary light transmitting regions;
   the long side directions of said first and second auxiliary light transmitting regions adjacent to each other between said first and second light transmitting regions being positioned at an angle other than zero so as to reduce the influence of exposing light which is transmitted through said first and second auxiliary light transmitting regions which are adjacent to each other.

2. A phase shift mask used for a lithographic process of transferring a pattern said mask comprising:
   a light blocking resist film formed on a substrate,
   a first and a second light transmitting region formed on said substrate adjacent to one another on said resist film for transmitting exposure light;
   a first auxiliary light transmitting region constituted by a first auxiliary light transmitting portion formed around said first light transmitting region on said substrate so as to have a long side direction to increase the resolution of said first light transmitting region; and
   a second auxiliary light transmitting region constituted by a second auxiliary light transmitting portion formed on said substrate around said second light transmitting region so as to have a long side direction which is positioned so as to increase the resolution of said second light transmitting region;
   said first and second auxiliary light transmitting regions which are adjacent to each other being formed on said substrate with phase differences between them and between said first and second light transmitting regions, so as to prevent mutual reinforcement of exposure light transmitted through said first and second auxiliary light transmitting regions which are adjacent to each other.

3. A phase shift mask used for a lithographic process of transferring a pattern, said mask comprising:
   a light-blocking resist film formed on a substrate by controlling the amount of transmission of exposure light;
   a first and a second light transmitting region formed on said substrate adjacent to one another on said resist for transmitting exposure light;
   a first auxiliary light transmitting region constituted by a first auxiliary light transmitting portion formed on said substrate around said first light transmitting region so as to have a long side direction which increases the resolution of said first light transmitting region; and
   a second auxiliary light transmitting region constituted by a second auxiliary light transmitting portion formed on said substrate around said second light transmitting region so as to have a long side direction which increases the resolution of said second light transmitting region;
   said first and second light transmitting regions being formed close to each other, a signal intermediate auxiliary light transmitting region formed on said substrate between said first and second light transmitting regions; and
   exposing light which is transmitted through said first and second light transmitting regions having different phases from exposing light which is transmitted through said first and second auxiliary light transmitting regions.

4. The phase shift mask according to claim 3, wherein said light transmitting regions are spaced close to each other by a predetermined distance, and said intermediate auxiliary light transmitting region is divided into a plurality of portions, said individual portions having phase differences relative to each other so as to reduce the intensity of exposure light which is transmitted through said divided intermediate auxiliary light transmitting region.

5. The phase shift mask according to claim 3, wherein the distance between said intermediate auxiliary light transmitting region which is formed between said light transmitting regions which are close to each other by a predetermined distance and each aid light transmitting region is in a range of $0.75 \times \lambda/NA$ to $1.0 \times \lambda/NA$ where $\lambda$ is the wavelength of the exposure light and NA is the aperture of the exposing device.

6. The phase shift mask according to claim 3, wherein said intermediate auxiliary light transmitting region formed between said first and second light transmitting regions which are close to each other has a small light transmitting portion area as compared to the other auxiliary light transmitting regions.

7. The phase shift mask according to claim 3, wherein said intermediate auxiliary light transmitting regions which are close to each other at least has a low light permeability as compared to other auxiliary light transmitting regions.

8. A phase shift mask used for a lithographic process of transferring a pattern said mask comprising;
   a light-blocking region on a substrate by controlling the amount of transmission of exposing light;
   a first and second light transmitting region formed adjacent to one another on said resist film for transmitting exposure light;
   a first auxiliary light transmitting region constituted by a first auxiliary light transmitting portion formed around said first light transmitting region formed on said substrate so as to have a long side direction so as to increase the resolution of said first light transmitting region; and
   a second AUXILIARY light transmitting region constituted by a second auxiliary light transmitting portion formed around said second light transmitting region on said substrate so as to have a long side direction so as to increase the resolution of said second light transmitting region;
   and the exposure light which is transmitted through said first and second light transmitting regions having different phases from exposure
   light which is transmitted through said first and second auxiliary light transmitting regions;
   and a third auxiliary light transmitting region which is different in phase from said first and second auxiliary light transmitting regions which is formed between said first and second auxiliary light transmitting regions which are adjacent to each other so as to reduce influence of exposure light transmitted through said first and second auxiliary light transmitting regions.

* * * * *